(12) United States Patent
Nomiyama et al.

(10) Patent No.: US 11,380,822 B2
(45) Date of Patent: Jul. 5, 2022

(54) RED PHOSPHOR AND LIGHT EMISSION DEVICE

(71) Applicant: DENKA COMPANY LIMITED, Tokyo (JP)

(72) Inventors: Tomohiro Nomiyama, Omuta (JP); Marina Takamura, Omuta (JP); Yusuke Takeda, Omuta (JP); Shintaro Watanabe, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 165 days.

(21) Appl. No.: 16/755,450

(22) PCT Filed: Oct. 2, 2018

(86) PCT No.: PCT/JP2018/036942
§ 371 (c)(1),
(2) Date: Apr. 10, 2020

(87) PCT Pub. No.: WO2019/073864
PCT Pub. Date: Apr. 18, 2019

(65) Prior Publication Data
US 2020/0251619 A1  Aug. 6, 2020

(30) Foreign Application Priority Data
Oct. 10, 2017  (JP) .............................. JP2017-197218

(51) Int. Cl.
*H01L 33/50* (2010.01)
*C09K 11/64* (2006.01)

(52) U.S. Cl.
CPC .............. *H01L 33/50* (2013.01); *C09K 11/64* (2013.01)

(58) Field of Classification Search
CPC ............. H01L 33/50; H01L 2933/0041; H01L 33/502; H01L 33/501; C09K 11/64
See application file for complete search history.

(56) References Cited

U.S. PATENT DOCUMENTS

| 2004/0135504 A1 | 7/2004 | Tamaki et al. |
| 2007/0007494 A1 | 1/2007 | Hirosaki et al. |
| 2014/0167601 A1 * | 6/2014 | Harry .................... H01L 33/504 |
| | | 313/503 |
| 2016/0312118 A1 * | 10/2016 | Fiedler ............... C09K 11/0883 |
| 2017/0137709 A1 * | 5/2017 | Matsumoto ........ C09K 11/0883 |
| 2017/0204328 A1 * | 7/2017 | Yoshimura ............ H01L 33/502 |
| 2017/0369774 A1 | 12/2017 | He et al. |
| 2018/0051208 A1 | 2/2018 | He et al. |
| 2019/0100693 A1 | 4/2019 | Lin et al. |

FOREIGN PATENT DOCUMENTS

| CN | 106281322 A | 1/2017 |
| JP | 2004-071726 A | 3/2004 |
| JP | 2005-336253 A | 12/2005 |
| JP | 2016-535800 A | 11/2016 |
| JP | 6381845 B1 | 8/2018 |
| WO | 2005/052087 A1 | 6/2005 |
| WO | 2012/053595 A1 | 4/2012 |
| WO | 2015/002139 A1 | 1/2015 |
| WO | 2016/021705 A1 | 2/2016 |
| WO | 2017/128492 A1 | 8/2017 |
| WO | 2017/128493 A1 | 8/2017 |
| WO | 2018/092696 A1 | 5/2018 |

OTHER PUBLICATIONS

Dec. 4, 2018 International Search Report issued in International Patent Application No. PCT/JP2018/036942.

* cited by examiner

*Primary Examiner* — Jonathan Han
(74) *Attorney, Agent, or Firm* — Oliff PLC

(57) ABSTRACT

The purpose of the invention is to both improve the luminance of a SCASN-based phosphor and achieve deep-color rendering properties. Provided is a red phosphor having a main crystal phase having the same crystal structure as a crystal structure of $CaAlSiN_3$, the main crystal phase represented by the general formula $MAlSiN_3$, wherein an internal quantum efficiency, as measured when the red phosphor is excited by light having a wavelength of 455 nm, is 71% or more, and M in the general formula represents an element group containing at least three elements selected from Eu, Sr, Mg, Ca, and Ba, the element group containing Eu, Sr, and Ca as essentials, and a Eu content is 4.5 mass % or more and 7.0 mass % or less, a Sr content is 34.0 mass % or more and 42.0 mass % or less, and a Ca content is 0.8 mass % or more and 3.0 mass % or less.

9 Claims, No Drawings

RED PHOSPHOR AND LIGHT EMISSION DEVICE

TECHNICAL FIELD

The invention relates to a red phosphor, and a light-emitting member and light emitting device using the red phosphor. In more detail, the invention relates to a highly luminous red phosphor that may preferably be used for a LED (also referred to as light-emitting diode) or a LD (also referred to as laser diode), and a light-emitting member and a light emitting device using the red phosphor.

BACKGROUND ART

A white LED is a device that emits pseudo-white light by a combination of a semiconductor light-emitting element and a phosphor, and a combination of a blue LED and a YAG yellow phosphor is known as a representative example of the white LED. However, a white LED of this type is deficient in a red-light-emitting component although the chromaticity coordinate values thereof fall within a white color region, and therefore has low color rendering properties for lighting uses, so that a problem is that the color reproducibility is poor in an image display device, such as a liquid crystal backlight. Thus, using a nitride or oxynitride phosphor that emits red light together with a YAG phosphor in order to supplement the deficient red-light-emitting component is proposed in Patent Literature 1.

A nitride phosphor that emits red light in which an inorganic compound having the same crystal structure as a crystal structure of $CaAlSiN_3$ (also generally written as CASN) is used as a host crystal and is activated by an optically active element, such as, for example, $Eu^{2+}$, is known as a CASN-based phosphor. In Patent Literature 2, it is described that a phosphor obtained by activating a host crystal of CASN by $Eu^{2+}$ (namely, Eu-activated CASN phosphor) emits light with high luminance. The luminescent color of the CASN phosphor contains a large amount of spectral components on the longer wavelength side in a red color region and therefore may realize high deep-color-rendering properties, but on the other hand, spectral components where visibility is low increase, and therefore still further improvements in luminance are desired.

Further, a phosphor wherein $(Sr, Ca)AlSiN_3$, in which some of Ca of $CaAlSiN_3$ described above is further replaced with Sr, is activated by $Eu^{2+}$ (also generally referred to as Eu-activated SCASN phosphor) is described in Patent Literature 2. In this Eu-activated SCASN phosphor, the emission peak wavelength shifts on the shorter wavelength side and spectral components in a region where the visibility is high increase more than in the case of a Eu-activated CASN phosphor, and therefore the luminance tends to be improved, and thus this Eu-activated SCASN phosphor is considered to be promising as a red phosphor for a highly luminous white LED.

CITATION LIST

Patent Literature

Patent Literature 1: Japanese Patent Laid-Open No. 2004-071726
Patent Literature 2: International Publication No. WO 2005/052087

SUMMARY OF INVENTION

Technical Problem

However, in the case of SCASN phosphor, when the Sr content is larger, the emission peak wavelength is shifted to the shorter wavelength side, and the half-width of the emission spectrum is narrower. Therefore, while on the other hand the luminance is improved due to narrowing of the half-width, the emission spectrum is shifted to the short wavelength side, and therefore a problem has been that deep-color rendering properties as in the CASN phosphor cannot be realized.

Solution to Problem

The present inventors have conducted diligent studies in order to solve the problem to find that by specifying the Eu content, the Sr content, and the Ca content in a particular composition range in a Eu-activated SCASN phosphor and allowing the Eu-activated SCASN phosphor to have a structure with fewer crystal defects so as to exhibit an internal quantum efficiency of a particular value or more, the half-width of the emission spectrum may be narrowed, and the emission peak wavelength may be controlled in a range where deep-color rendering properties are exhibited when packaging is performed, and thereby completed the invention. Therefore, by using this phosphor for a light emitting device, high luminance may be achieved without impairing the color rendering properties.

That is, the embodiment of the invention may provide the following.

(1) A red phosphor comprising a main crystal phase having the same crystal structure as a crystal structure of $CaAlSiN_3$, the main crystal phase represented by the general formula $MAlSiN_3$, wherein M in the general formula represents an element group comprising at least three elements selected from Eu, Sr, Mg, Ca, and Ba, the element group comprising Eu, Sr, and Ca as essentials, and a Eu content is 4.5 mass % or more and 7.0 mass % or less, a Sr content is 34.0 mass % or more and 42.0 mass % or less, and a Ca content is 0.8 mass % or more and 3.0 mass % or less; and an internal quantum efficiency, as measured when the red phosphor is excited by light having a wavelength of 455 nm, is 71% or more.

(2) The red phosphor according to (1), absorbing light in a region of ultraviolet rays to visible light to emit light such that an emission peak wavelength is in a range of 635 nm to 650 nm, and a half-width of an emission spectrum is 80 nm or less.

(3) The red phosphor according to (1) or (2), wherein M in the general formula represents an element group consisting of Eu, Sr, and Ca.

(4) A light-emitting member comprising the red phosphor according to any one of (1) to (3).

(5) A light emitting device comprising the light-emitting member according to (4).

(6) A method for producing a red phosphor comprising a main crystal phase having the same crystal structure as a crystal structure of $CaAlSiN_3$, the main crystal phase represented by the general formula $MAlSiN_3$, the method comprising:

a mixing step of mixing raw materials; and a calcination step of calcining the raw materials after the mixing step, thereby forming the red phosphor, wherein M in the general formula represents an element group comprising at least three elements selected from Eu, Sr, Mg, Ca, and Ba, the element group comprising Eu, Sr, and Ca as essentials;

in the resultant red phosphor, a Eu content is 4.5 mass % or more and 7.0 mass % or less, a Sr content is 34.0 mass % or more and 42.0 mass % or less, and a Ca content is 0.8 mass % or more and 3.0 mass % or less; and an internal quantum efficiency of the resultant red phosphor, as measured when the red phosphor is excited by light having a wavelength of 455 nm, is 71% or more.

(7) The production method according to (6), wherein the resultant red phosphor absorbs light in a region of ultraviolet rays to visible light to emit light such that an emission peak wavelength is in a range of 635 nm to 650 nm, and a half-width of an emission spectrum is 80 nm or less.

(8) The production method according to (6) or (7), further comprising an annealing treatment step of carrying out annealing and calcination after the calcination step.

(9) The production method according to (8), wherein the annealing treatment step is performed under a condition of a temperature of 1100° C. or more and 1650° C. or less and a pressure of 0.65 MPaG or less in an inert gas atmosphere.

Advantageous Effects of Invention

According to an embodiment of the invention, a highly luminous Eu-activated SCASN-based phosphor may be provided, and a highly luminous and highly color-rendering light-emitting member (also referred to as light-emitting element) may be provided through combination with a light-emitting source, such as a LED. Further, according to an embodiment of the invention, a light emitting device including: a highly luminous and highly color-rendering light-emitting member; and an instrument that stores the light-emitting member may also be provided. Examples of such a light emitting device include a lighting device, a backlight device, an image display device, and a signaling device.

DESCRIPTION OF EMBODIMENTS

Hereinafter, embodiments for carrying out the invention will be described in detail. In the specification, numerical value ranges include the upper limit value and the lower limit value unless otherwise noted.

A red phosphor according to an embodiment of the invention is a phosphor having a main crystal phase having the same crystal structure as a crystal structure of $CaAlSiN_3$, the main crystal phase represented by the general formula $MAlSiN_3$. Whether the main crystal phase of the phosphor has the same crystal structure as the crystal structure of the $CaAlSiN_3$ crystal or not may be checked by powder X-ray diffraction. It is not preferable that the crystal structure is different from that of $CaAlSiN_3$ because the luminescent color is not red, or the luminance is significantly lowered. Consequently, the red phosphor is preferably a single phase where a crystal phase other than the main crystal phase (also referred to as heterogeneous phase) is not mixed, if possible, but may contain a heterogeneous phase as long as the heterogeneous phase does not give a significant influence on the phosphor properties.

M in the general formula $MAlSiN_3$ represents an element group containing at least three elements selected from Eu, Sr, Mg, Ca, and Ba, the element group containing Eu, Sr, and Ca as essentials. It is to be noted that a subscript that represents the number of atoms is not added to M in the general formula, which does not necessarily mean that the subscript is one because this notation is for convenience of existence of room for choosing an element or elements.

In addition, to obtain desired properties, it is required in the red phosphor that the Eu content is 4.5 mass % or more and 7.0 mass % or less, the Sr content is 34.0 mass % or more and 42.0 mass % or less, and the Ca content is 0.8 mass % or more and 3.0 mass % or less based on the whole amount of the composition of the phosphor, and if the contents are out of these requirements, the luminance and the color rendering properties are deteriorated, which is problematic. In a preferred embodiment, the Eu content may be in a range of 5.0 mass % or more and 7.0 mass % or less, more preferably in a range of 5.0 mass % or more and 6.7 mass % or less. In a preferred embodiment, the Sr content may be in a range of 34.0 mass % or more and 41.0 mass % or less, more preferably in a range of 36.0 mass % or more and 40.0 mass % or less. In a preferred embodiment, the Ca content may be in a range of 0.8 mass % or more and 2.9 mass % or less, more preferably in a range of 0.8 mass % or more and 2.8 mass % or less. In a particular embodiment, when the Ca content is 0.8 mass % or more and 1.0 mass % or less, more preferably 0.8 mass % or more and 0.9 mass % or less, an effect of reducing crystal defects may thereby be exhibited.

Eu is an atom that bears the luminescence of the phosphor, namely, the luminescent center, and therefore when the content is extremely small (for example, the content is less than 4.5 mass %), the luminance as a phosphor is insufficient, and the emission peak wavelength shifts to the shorter wavelength side, so that deep-color rendering properties cannot be realized. However, the Eu content specified in the invention is preferable because the emission peak wavelength shifts to the longer wavelength side while keeping a high luminance, so that the emission peak wavelength in a range of 635 nm to 650 nm, where high color-rendering properties are exhibited when a package is made. In the past, it has been difficult to dissolve an excessive amount of Eu in a SCASN phosphor from the reason that when the Eu content is too high (for example, the content exceeds 7 mass %), Eu does not dissolve in the phosphor and volatilizes during synthesis, solid-solution of Eu progresses in a heterogeneous phase such as $Sr_2Si_5N_8$, or other reasons. In addition, when the Eu content is too high, a tendency for the luminance to be lowered occurs from the reasons that 1) a loss phenomenon, known as concentration quenching of a phosphor, due to energy transfer among Eu atoms occurs, and 2) a tendency for the luminance of a phosphor to be lowered due to occurrence of crystal defects or the like is seen. In contrast, the embodiments of the invention enable enhancement of the Eu content without lowering the luminance of the phosphor by reducing crystal defects (for example, by an annealing treatment under a particular annealing condition, or a particular element composition).

When the Sr content is less than 34.0 mass %, the luminance of the phosphor is lowered with broadening of the emission spectrum, and when the Sr content exceeds 42.0 mass %, the emission peak wavelength shifts significantly to the shorter wavelength side, and therefore the deep-color rendering properties cannot be realized. In addition when the Ca content is less than 0.8 mass %, the emission peak wavelength shifts significantly to the shorter wavelength side, and therefore the deep-color rendering properties cannot be realized, and when the Ca content exceeds 3.0 mass %, the following problem occurs: the luminance of the phosphor lowers with broadening of the emission spectrum.

It is to be noted that a slight amount of oxygen (O) is contained as an unavoidable component in the red phosphor in some cases, which does not matter as long as the oxygen does not impair the properties as a phosphor, and in the red phosphor, the contents of the M elements, the Si/Al ratio, the N/O ratio, and the like may be adjusted in such a way that the electrical neutrality is kept as a whole while retaining the crystal structure.

The half-width of the emission spectrum of the red phosphor is preferably narrow in order to obtain a high emission intensity. The half-width is preferably, for example, 80 nm or less, more preferably 78 nm or less, and still more preferably 76 nm or less. When the half-width exceeds 80 nm, the emission intensity of a resultant phosphor is lowered in some cases.

In a preferred embodiment, the red phosphor may have a structure with fewer crystal defects, and an effect of efficiently converting light in a blue region into red light is thereby exhibited. Although it is not desired to be bound by a particular theory, it is considered that obtaining a structure with fewer crystal defects may be realized by, for example, performing an annealing (treatment) step after a calcination step when the phosphor is produced, suppressing the amount of Ca in the element composition to about 0.8 to about 1.0 mass %, and so on. The degree to which the number of the crystal defects is small may be evaluated quantitatively by the internal quantum efficiency. In the red phosphor, the internal quantum efficiency, as measured when the red phosphor is excited by light having a wavelength of 455 nm, is required to be 71% or more, and may preferably be 73% or more, still more preferably 75% or more. When the internal quantum efficiency is less than 71%, the luminance is lowered, which is problematic.

In addition, the red phosphor is used as fine particles, and when the median size (also written as d50) is too small, the luminance of fluorescence tends to be lowered, when the median size is too large, variation tends to occur in the chromaticity of the luminescent color or color unevenness in the luminescent color tends to occur when the phosphor is mounted on a light-emitting surface of a LED, and therefore d50 is preferably 1 μm or more and 50 μm or less. It is to be noted that d50 described above is a value calculated from the volume average size measured by a laser diffraction scattering method in accordance with JISR1622:1995 and R1629:1997.

Further, the red phosphor has a 10 volume % size (also written as d10) in a particle size distribution in terms of volume of 4 μm or ore, the particle size distribution measured by a laser diffraction scattering method, and preferably has a 90 volume % size (also written as d90) of 55 μm or less.

A method for producing the red phosphor is required to include: a mixing step of mixing raw materials; and a calcination step of calcining the raw materials after the mixing step, thereby forming the red phosphor. In a preferred embodiment, an annealing treatment step of carrying out annealing and calcination after the calcination step may further be included.

In the mixing step of mixing the raw materials, powders of nitrides of the elements that constitute the red phosphor, namely calcium nitride, silicon nitride, aluminum nitride, strontium nitride, europium nitride, are each suitably used as a raw material, but the oxides of those elements may also be used. For example, a powder of europium oxide that is more easily available than europium nitride may be used as a source of europium whose content in the phosphor is very small.

The method of mixing the raw materials is not particularly limited, but it is suitable to make a raw materials-mixed powder in such a way as to handle calcium nitride, strontium nitride, and europium nitride in particular, which react vigorously with moisture and oxygen in the air, in a glove box the inside of which is replaced with an inert gas atmosphere, and further, carry out in the glove box filling a calcination container with the raw materials-mixed powder. In addition, after the calcination container filled with the raw materials-mixed powder is taken out of the glove box, it is preferable to set the calcination container quickly to start calcination.

In the calcination step of calcining the raw materials after the mixing step, thereby forming the red phosphor, the atmosphere and the calcination temperature are not particularly limited, and the raw materials-mixed powder may usually be calcined, for example, under a condition of usually 1600° C. or more and 2000° C. or less, preferably 1700° C. or more and 2000° C. or less in a nitrogen atmosphere. In some cases, it is not preferable that the calcination temperature is lower than 1600° C. because the amount of unreacted residues is large, and that the calcination temperature exceeds 2000° C. because the main phase having the same crystal structure as the crystal structure of $CaAlSiN_3$ decomposes.

In addition, the time for calcining the raw materials-mixed powder in the calcination step is not particularly limited, the range of the calcination time where a disadvantage, such that a large amount of unreacted substances exist, grain growth is insufficient, or productivity is lowered, does not occur may appropriately be selected, and in general, the calcination time is preferably 2 hours or more and 24 hours or less.

The higher the pressure of the atmosphere in the calcination step is set, the higher the decomposition temperature of the phosphor may be set, but when the industrial productivity is taken into consideration, the pressure of the atmosphere is preferably less than 1 MPaG (gauge pressure). The pressure of the atmosphere may be, for example, 0.7 MPaG or more, preferably 0.8 MPaG or more.

It is to be noted that the calcination container which is used in the calcination step is preferably constituted with a material that is stable in a high-temperature nitrogen atmosphere and is unlikely to react with the raw materials-mixed powder and the reaction product thereof, and examples thereof include containers each made of boron nitride, a high-melting-point metal, such as molybdenum, tantalum, and tungsten, and carbon. In addition, the calcination container is preferably a container with a lid.

Various states, such as a powder, a lump, and a sintered body, of the red phosphor which is obtained by calcination exist according to the combination of the raw materials and the calcination condition. When the red phosphor is used as a phosphor as a light-emitting member which is used for an actual light emitting device, the phosphor is made into a powder having a predetermined size by combining cracking and pulverization and/or classification operations. When the red phosphor is suitably used as a phosphor for a LED, the average particle size of the phosphor is preferably adjusted in such a way as to be 5 to 35 μm. It is to be noted that the cracking, and pulverization and/or classification operations may appropriately be performed after the calcination step, after the annealing step, or after other steps.

In the annealing step, the pressure of the atmosphere is preferably vacuum or in a range of 0.65 MPaG or less in an inert gas atmosphere. In some cases, it is not preferable that the pressure of the atmosphere exceeds 0.65 MPaG because crystal defects which has occurred at the time of the calcination cannot be reduced. On the other hand, it is generally preferable to set the pressure of the atmosphere to be lower because the crystal defects may be reduced. By reducing the crystal defects, making the phosphor highly luminous is desired. In addition, examples of the inert gas which is used as an atmospheric gas include hydrogen, nitrogen, argon, and helium, and particularly, hydrogen and argon are preferable.

The annealing temperature in the annealing step is preferably 1100° C. or more and 1650° C. or less. In some cases, it is not preferable that the annealing temperature is lower than 1100° C. because the crystal defects that has occurred at the time of the calcination cannot be reduced, and that the annealing temperature exceeds 1650° C. because the main phase of SCASN decomposes under a condition of vacuum or of a pressure range of 0.65 MPaG or less in an inert gas atmosphere. The retention time of the annealing step may be arbitrarily set, but the retention time is preferably made long to such an extent that the effect of annealing may be exhibited and may be in a range of, for example, 4 to 24 hours.

It is to be noted that the container which is used in the annealing step is preferably constituted with a material that is stable in a high-temperature inert atmosphere and is unlikely to react with the reaction product obtained by the calcination, and examples thereof include containers each made of a high-melting-point metal, such as molybdenum, tantalum, and tungsten. In addition, the container is preferably a container with a lid.

Moreover, in the production of the red phosphor, an acid treatment step may further be carried out after the annealing step in order to remove impurities in the phosphor.

A certain embodiment of the invention may be used for a light-emitting member which is sealed by a sealing material containing the red phosphor of the invention and is combined with, for example, an excitation light source, which is a semiconductor light-emitting element, and may provide such a light-emitting member. Further, another embodiment may provide a light emitting device including the light-emitting member. It is to be noted that the red phosphor has a property such that the red phosphor is irradiated with ultraviolet light or visible light including wavelengths of 350 nm or more and 500 nm or less and is thereby excited to emit fluorescence having a peak in a wavelength region of 635 nm or more and 650 nm or less, and therefore an ultraviolet LED or a blue LED is preferably used as the semiconductor light-emitting element. In addition, if necessary, a phosphor that emits green to yellow light and/or a blue phosphor may further be added to the sealing material containing the red phosphor, and by doing so, white light as a whole is obtained.

EXAMPLES

The invention will be described in more detail giving Examples. However, the invention is not limited to only the contents given in the Examples.

Comparative Example a1

Hereinafter, the method for producing and method for evaluating the phosphor of the invention, which are given in Examples and Comparative Examples, will be described specifically. A phosphor of Comparative Example a1 was produced through the step of mixing the raw materials and the step of calcining the raw materials, but not through the annealing step.

(Production Method)

As raw materials for the phosphor of Comparative Example a1, 63.1 g of an a type silicon nitride powder ($Si_3N_4$, SN-E10 grade, manufactured by Ube Industries, Ltd.), 55.3 g of an aluminum nitride powder (AlN, E-Grade, manufactured by Tokuyama Corporation), and 14.3 g of a europium oxide powder ($Eu_2O_3$, RU grade, manufactured by Shin-Etsu Chemical Co., Ltd.) were preliminarily mixed in advance, and subsequently in a glove box retained in a nitrogen atmosphere having a moisture content of 1 mass ppm or less and an oxygen content of 1 mass ppm or less, 6.0 g of a calcium nitride powder ($Ca_3N_2$, manufactured by Materion Corporation), and 111.3 g of a strontium nitride powder ($Sr_3N_2$, purity 2N, manufactured by Kojundo Chemical Laboratory Co., Ltd.) were further added to perform dry mixing, and thus a raw materials-mixed powder was obtained. A tungsten container with a lid was filled with 250 g of this raw materials-mixed powder.

The container filled with the raw materials-mixed powder was taken out of the glove box and quickly set in an electric furnace provided with a carbon heater, and the inside of the furnace was evacuated sufficiently to 0.1 PaG or less. Heating was started while the evacuation was continued, and after the temperature reached 600° C., a nitrogen gas was introduced into the furnace to make the pressure of the atmosphere in the furnace 0.9 MPaG. After the introduction of the nitrogen gas was started, temperature elevation was continued up to 1950° C. to perform calcination for 8 hours at this retention temperature of calcination, and thereafter heating was completed to perform cooling.

After cooling was performed to room temperature, a red lump substance collected from the container was crushed in a mortar to finally obtain a powder having passed through a sieve having an opening of 75 μm.

(Checking Crystal Structure)

The crystal structure of the obtained phosphor was checked by a powder X-ray diffraction pattern using a CuKα ray with an X-ray diffractometer (Ultima IV manufactured by Rigaku Corporation). As a result, in the powder X-ray diffraction pattern of the obtained phosphor of Comparative Example a1, a diffraction pattern which is the same as the diffraction pattern of a $CaAlSiN_3$ crystal was recognized.

(Quantitative Analysis of Eu, Sr, and Ca)

The Eu, Sr, and Ca contents in the obtained phosphor were analyzed quantitatively using an ICP emission spectrometer (CIROS-120 manufactured by Rigaku Corporation) after the phosphor was dissolved by a pressurized acidolysis method. As a result, in the phosphor of Comparative Example a1, the Eu content was 5.1 mass %, the Sr content was 40.0 mass %, and the Ca content was 2.2 mass %.

(Evaluation of Half-Width)

The half-width was measured as follows. Firstly, a standard reflector having a reflectance of 99% (CSRT-99-020, Spectralon manufactured by Labsphere, Inc.) was attached to an integrating sphere, and monochromatic light separated from an emission light source (Xe lamp) in such a way as to have a wavelength of 455 nm was introduced into this integrating sphere using an optical fiber. An excitation spectrum using this monochromatic light as an excitation source was measured using a spectrophotometer (MCPD-7000 manufactured by Otsuka Electronics, Co., Ltd.). On that occasion, the number of photons of the excitation light (Qex) was calculated from the spectrum in a wavelength range of 445 nm to 465 nm. Subsequently, the phosphor, which filled a cell in a recessed portion in such a way that the surface was smooth, was set in place of the standard reflector to measure the fluorescence spectrum of the phosphor, and the half-width was obtained from obtained spectral data. As a result, the half-width of the emission spectrum, which the phosphor of Comparative Example a1 had emitted, was 75 nm.
(Evaluation of Fluorescence Properties)

The fluorescence properties of the phosphor were evaluated using a spectrophotometer (F-7000 manufactured by Hitachi High-Technology Corporation) corrected with rhodamine B and a substandard light source. A solid sample holder that is an accessory of the spectrophotometer was used for the measurement to determine a fluorescence spectrum at an excitation wavelength of 455 nm. As a result, the peak wavelength of the fluorescence spectrum, which the phosphor of Comparative Example a1 had emitted, was 640 nm. It is to be noted that the luminance of the phosphor changes depending on the measurement apparatus and condition, and therefore the value of the peak intensity of the fluorescence spectrum of Comparative Example a1 was used as a standard for evaluating the other Examples and Comparative Examples assuming the value to be 100%.
(Evaluation of PKG (Package) Properties)

A white LED was prepared in such a way that the phosphor of Comparative Example a1 was added together with a LuAG yellow phosphor (having an emission peak wavelength of 535 nm when received excitation light having a wavelength of 455 nm) to a silicone resin, and after a resultant mixture was defoamed/kneaded, potting the mixture in a surface-mounted type package with a blue LED element having a peak wavelength of 450 nm jointed thereto was performed, and further, the mixture was heat-cured to prepare a white LED. The ratio of the amount of the SCASN phosphor added to the amount of the LuAG phosphor added was adjusted in such a way that the color coordinate (x, y) of the white LED at the time of emission by energization was (0.45, 0.41).

Next, measurement was performed on the obtained white LED with a total luminous flux measurement apparatus (an apparatus in which an integrating sphere having a diameter of 300 mm and a spectrophotometer/MCPD-9800 are combined). The general color rendering index (Ra) of the obtained white LED package was 90. In addition, the value of the total luminous flux value in Example 1 was used as a standard for evaluating the other Examples and Comparative Examples assuming the value to be 100%.
(Evaluation of Quantum Efficiency)

The internal quantum efficiency was measured as follows. A standard reflector having a reflectance of 99% (Spectralon manufactured by Labsphere Inc.) was set at a side opening ($\phi$ 10 mm) of an integrating sphere ($\phi$ 60 mm) at room temperature. Monochromatic light separated from an emission light source (Xe lamp) in such a way as to have a wavelength of 455 nm was introduced into this integrating sphere with an optical fiber, and a spectrum of reflection light was measured with a spectrophotometer (MCPD-7000 manufactured by Otsuka Electronics, Co., Ltd.). On that occasion, the number of photons of the excitation light (Qex) was calculated from the spectrum in a wavelength range of 445 nm to 465 nm. Next, a recessed cell, which was filled with the phosphor in such a way that the surface was smooth, was set at an opening of the integrating sphere, and was irradiated with monochromatic light having a wavelength of 455 nm to measure the spectrum of the reflection light of excitation and the spectrum of the fluorescence with a spectrophotometer. The number of photons of the reflection light of excitation (Qref) and the number of photons of the fluorescence (Qem) were calculated from obtained spectral data. The number of photons of the reflection light of excitation was calculated in the same wavelength range as the number of photons of the excitation light, and the number of photons of the fluorescence was calculated in a range of 465 to 800 nm. The external quantum efficiency (=Qem/Qex×100), the absorptivity (=(Qex−Qref)/Qex× 100), and the internal quantum efficiency (=Qem/(Qex− Qref)×100) were determined from the obtained three types of the numbers of photons.

The Eu, Sr, and Ca contents, the internal quantum efficiency, the peak wavelength and half-width of the fluorescence spectrum, the peak emission intensity, and Ra and the total luminous flux value, measured when a package was made, of the phosphor of Comparative Example a1 are shown together in Table 1 below.

TABLE 1

| | Content in phosphor | | | Internal quantum efficiency (%) | Peak wavelength (nm) | Half-width (nm) | Emission intensity (%) | PKG properties | |
|---|---|---|---|---|---|---|---|---|---|
| | Eu (mass %) | Sr (mass %) | Ca (mass %) | | | | | Ra | Total luminous flux value (%) |
| Comparative Example a1 | 5.1 | 40.0 | 2.2 | 59 | 640 | 75 | 100 | 90 | 100 |
| Comparative Example a2 | 5.6 | 37.4 | 2.8 | 57 | 644 | 78 | 92 | 90 | 99 |
| Comparative Example a3 | 6.6 | 36.8 | 1.6 | 67 | 648 | 76 | 114 | 91 | 99 |
| Example a1 | 6.0 | 38.8 | 0.8 | 73 | 639 | 73 | 129 | 88 | 100 |
| Comparative Example a4 | 0.6 | 20.9 | 14.7 | 84 | 643 | 89 | 106 | 89 | 100 |
| Comparative Example a5 | 6.5 | 34.7 | 2.9 | 51 | 646 | 85 | 83 | 89 | 94 |
| Comparative Example a6 | 4.2 | 36.1 | 2.1 | 62 | 632 | 77 | 97 | 83 | 104 |
| Comparative Example a7 | 4.5 | 39.4 | 0.2 | 78 | 633 | 72 | 135 | 83 | 106 |

Comparative Examples a2 to a7 and Example a1

Powders of phosphors of Comparative Examples a2 to a7 and Example a1 were each prepared using the same raw material powder as the raw material powder of Comparative Example a1 under the same production condition as in Comparative Example a1, except that the Eu, Sr, and Ca contents in the phosphor were changed. A diffraction pattern which is the same as the diffraction pattern of the $CaAlSiN_3$ crystal was recognized in all of the powder X-ray diffraction patterns of the obtained samples.

From the results of Examples and Comparative Examples shown in Table 1 above, it is found that the half-widths of the red phosphors in which the Eu, Sr, and Ca contents in the phosphors are specified in a particular range are narrow in the emission peak wavelength in a range of 635 nm to 650 nm, as narrow as 80 nm or less. On the other hand, in the compositions such as those of Comparative Examples a4 and a5, the emission peak wavelength in the range of 635 nm to 650 nm was achieved, but widening of the half-width occurred, which is problematic. It is also found that a shift of the emission peak wavelength to the side of the wavelength shorter than 635 nm occurred, which is problematic, in the compositions such as those of Comparative Examples a6 and a7.

Example b1

Example b1 as a phosphor which is produced through the step of mixing raw materials, the calcination step, and the annealing step was produced as follows. A tungsten container was filled with a calcined powder obtained in Comparative Example a1, and was quickly set in an electric furnace provided with a carbon heater, and the inside of the furnace was evacuated sufficiently to 0.1 PaG or less. Heating was started while the evacuation was continued, and after the temperature reached 600° C., an argon gas was introduced into the furnace to make the pressure of the atmosphere in the furnace 0.2 MPaG. After the introduction of the argon gas was started, temperature elevation was continued up to 1300° C. to perform an annealing treatment at 1300° C. for 8 hours after the temperature elevation, and thereafter heating was completed to perform cooling. After cooling was performed to room temperature, a resultant product was collected from the container to obtain a powder having passed through a sieve having an opening of 75 μm. The obtained powder was used as a phosphor of Example b1. The internal quantum efficiency, the peak wavelength, the half-width, the peak emission intensity, and the package properties were evaluated for the phosphor of Example b1 in the same manner as in Example a1 described above. It is to be noted that the composition is considered not to be changed by the annealing step, and therefore the Eu, Sr, and Ca contents in Example b1 are the same as those in Comparative Example a1.

The peak wavelength and half-width of the fluorescence spectrum, the internal quantum efficiency, the peak intensity, and Ra and the total luminous flux value, measured when a package was made, of the phosphor of Example b1 are shown together in Table 2 below.

TABLE 2

| | Content in phosphor | | | Annealing condition | | | Internal quantum efficiency (%) | Peak wavelength (nm) | Half-width (nm) | Emission intensity (%) | PKG properties | |
|---|---|---|---|---|---|---|---|---|---|---|---|---|
| | Eu mass (%) | Sr (mass %) | Ca (mass %) | Temperature (° C.) | Pressure (MPaG) | Atmospheric gas | | | | | Ra | Total luminous flux value (%) |
| Example b1 | 5.1 | 40.0 | 2.2 | 1300 | 0.2 | Argon | 79 | 641 | 75 | 133 | 90 | 102 |
| Example b2 | 5.6 | 37.4 | 2.8 | 1300 | 0.2 | Argon | 79 | 644 | 76 | 135 | 91 | 102 |
| Example b3 | 6.6 | 36.8 | 1.6 | 1300 | 0.2 | Argon | 75 | 644 | 76 | 128 | 91 | 101 |
| Example b4 | 6.0 | 38.8 | 0.8 | 1300 | 0.2 | Argon | 78 | 639 | 73 | 139 | 89 | 102 |
| Example b5 | 5.1 | 40.0 | 2.2 | 1200 | 0.2 | Argon | 78 | 641 | 75 | 131 | 90 | 101 |
| Example b6 | 5.1 | 40.0 | 2.2 | 1500 | 0.2 | Argon | 78 | 642 | 75 | 132 | 91 | 101 |
| Example b7 | 5.1 | 40.0 | 2.2 | 1300 | 0.01 | Argon | 80 | 641 | 74 | 133 | 90 | 101 |
| Example b8 | 5.1 | 40.0 | 2.2 | 1300 | 0.6 | Argon | 75 | 641 | 75 | 129 | 90 | 101 |
| Example b9 | 5.1 | 40.0 | 2.2 | 1300 | 0.2 | Hydrogen | 81 | 640 | 75 | 134 | 90 | 101 |
| Example b10 | 5.1 | 40.0 | 2.2 | 1300 | 0.2 | Nitrogen | 75 | 641 | 75 | 124 | 90 | 101 |
| Example b11 | 6.5 | 34.7 | 2.9 | 1300 | 0.2 | Argon | 76 | 646 | 85 | 112 | 89 | 100 |
| Comparative Example b1 | 0.6 | 20.9 | 14.7 | 1300 | 0.2 | Argon | 84 | 643 | 89 | 108 | 89 | 98 |
| Comparative Example b2 | 5.1 | 40.0 | 2.2 | 1000 | 0.2 | Argon | 70 | 641 | 75 | 101 | 90 | 100 |
| Comparative Example b3 | 5.1 | 40.0 | 2.2 | 1700 | 0.2 | Argon | 68 | 641 | 78 | 101 | 90 | 100 |
| Comparative Example b4 | 5.1 | 40.0 | 2.2 | 1300 | 0.7 | Argon | 69 | 641 | 76 | 101 | 90 | 100 |

Examples b2 to b4, and Comparative Example b1

Examples b2 to b4 were prepared under the same condition as in Example b1, except that the calcined powders obtained in Comparative Example a2, Comparative Example a3, and Example a1 were used respectively in place of the calcined powder used in Example b1. In addition, Comparative Example b1 was prepared under the same condition as in Example b1, except that the calcined powder obtained in Comparative Example a4 was used in place of the calcined powder used in Example b1.

Examples b5 and b6

Examples b5 and b6 were prepared under the same condition as in Example b1, except that the retention temperature of the annealing treatment was changed to 1200° C. and 1500° C. respectively.

Examples b7 and b8

Examples b7 and b8 were prepared under the same condition as in Example b1, except that the pressure of the atmosphere in the furnace at the time of the annealing treatment was changed to 0.01 MPaG and 0.6 MPaG respectively.

Examples b9 and b10

Examples b9 and b10 were prepared under the same condition as in Example b1, except that the atmospheric gas at the time of the annealing treatment was changed to hydrogen and nitrogen respectively.

Example b11

Example b11 was prepared under the same condition as in Example b1, except that the calcined powder obtained in Comparative Example a5 was used in place of the calcined powder used in Example b1.

Comparative Examples b2 and b3

Comparative Examples b2 and b3 were prepared under the same condition as in Example b1, except that the retention temperature at the time of the annealing treatment was changed to 1000° C. and 1700° C. respectively.

Comparative Example b4

Comparative Example b4 was prepared under the same condition as in Example b1, except that the pressure of the atmosphere in the furnace at the time of the annealing treatment was changed to 0.7 MPaG.

From the results of Examples and Comparative Examples shown in Table 2, it is found that the SCASN phosphors having an element composition and an internal quantum efficiency each in a particular range have relatively high emission intensity and color rendering properties when a package is made. It is also found from Tables 1 and 2 that when the annealing treatment is carried out, the emission intensity increases significantly in the SCASN phosphor having a particular composition range. In addition, particularly when Comparative Examples where the annealing step was not performed and Examples where the annealing step was performed are compared, it can be ascertained that crystal defects are reduced, the internal quantum efficiency is dramatically improved, the peak emission intensity is improved sufficiently, and the color rendering properties are not impaired by the annealing step. Moreover, it is also understood that when the amount of Ca in the element composition is about 0.8 to about 1.0 mass %, the internal quantum efficiency is sufficiently high and crystal defects may be reduced without the annealing step. Further, it is also understood that in Comparative Examples a4 and a7 where the internal quantum efficiency is high, but the predetermined element composition ratio is not satisfied, a problem occurred in the half-width or the package property (Ra).

INDUSTRIAL APPLICABILITY

The SCASN-based red phosphor is excited by blue light and exhibits high luminous red emission and exhibits high color-rendering properties when a package is made, therefore may suitably be used as a phosphor for a white LED using blue light as a light source and may suitably be used for a light emitting device, such as a lighting tool and an image display device.

The invention claimed is:

1. A red phosphor comprising a main crystal phase having the same crystal structure as a crystal structure of $CaAlSiN_3$, the main crystal phase represented by the general formula $MAlSiN_3$, wherein
M in the general formula represents an element group comprising at least three elements selected from Eu, Sr, Mg, Ca, and Ba, the element group comprising Eu, Sr, and Ca as essentials, and, relative to a total content of the red phosphor, a Eu content is 4.5 mass % or more and 7.0 mass % or less, a Sr content is 34.0 mass % or more and 42.0 mass % or less, and a Ca content is 0.8 mass % or more and 3.0 mass % or less; and
an internal quantum efficiency, as measured when the red phosphor is excited by light having a wavelength of 455 nm, is 71% or more.

2. The red phosphor according to claim 1, absorbing light in a region of ultraviolet rays to visible light to emit light such that an emission peak wavelength is in a range of 635 nm to 650 nm, and a half-width of an emission spectrum is 80 nm or less.

3. The red phosphor according to claim 1, wherein M in the general formula represents an element group consisting of Eu, Sr, and Ca.

4. A light-emitting member comprising the red phosphor according to claim 1.

5. A light emitting device comprising the light-emitting member according to claim 4.

6. A method for producing a red phosphor comprising a main crystal phase having the same crystal structure as a crystal structure of $CaAlSiN_3$, the main crystal phase represented by the general formula $MAlSiN_3$, the method comprising:
a mixing step of mixing raw materials; and
a calcination step of calcining the raw materials after the mixing step, thereby forming the red phosphor, wherein
M in the general formula represents an element group comprising at least three elements selected from Eu, Sr, Mg, Ca, and Ba, the element group comprising Eu, Sr, and Ca as essentials;
in the resultant red phosphor, relative to a total content of the red phosphor, a Eu content is 4.5 mass % or more and 7.0 mass % or less, a Sr content is 34.0 mass % or more and 42.0 mass % or less, and a Ca content is 0.8 mass % or more and 3.0 mass % or less; and
an internal quantum efficiency of the resultant red phosphor, as measured when the red phosphor is excited by light having a wavelength of 455 nm, is 71% or more.

7. The production method according to claim 6, wherein the resultant red phosphor absorbs light in a region of ultraviolet rays to visible light to emit light such that an emission peak wavelength is in a range of 635 nm to 650 nm, and a half-width of an emission spectrum is 80 nm or less.

8. The production method according to claim 6, further comprising an annealing treatment step of carrying out annealing and calcination after the calcination step.

9. The production method according to claim 8, wherein the annealing treatment step is performed under a condition of a temperature of 1100° C. or more and 1650° C. or less and a pressure of 0.65 MPaG or less in an inert gas atmosphere.

* * * * *